United States Patent [19]
Kondo et al.

[11] Patent Number: 4,948,754
[45] Date of Patent: Aug. 14, 1990

[54] METHOD FOR MAKING A SEMICONDUCTOR DEVICE

[75] Inventors: Kenji Kondo, Hoi; Hachiro Kunda, Chiryu; Toshio Sonobe, Okazaki, all of Japan

[73] Assignee: Nippondenso Co., Ltd., Kariya, Japan

[21] Appl. No.: 238,400

[22] Filed: Aug. 31, 1988

[30] Foreign Application Priority Data

Sep. 2, 1987 [JP] Japan .................. 62-220031

[51] Int. Cl.⁵ ............................. H01L 21/92
[52] U.S. Cl. ................... 437/183; 437/182; 437/189; 437/190; 148/DIG. 54
[58] Field of Search .............. 437/183, 182, 189, 190; 148/DIG. 54

[56] References Cited

U.S. PATENT DOCUMENTS

| 3,751,292 | 8/1973 | Kongable | 437/182 |
| 3,874,072 | 4/1975 | Rose et al. | 437/183 |
| 3,935,635 | 2/1976 | Botzenhardt | 437/183 |
| 4,087,314 | 5/1978 | George et al. | 437/183 |
| 4,349,609 | 9/1982 | Takeda et al. | 437/203 |

FOREIGN PATENT DOCUMENTS

| 026166 | 2/1977 | Japan | 437/183 |
| 0041731 | 3/1980 | Japan | 437/183 |
| 0028858 | 2/1983 | Japan | 437/183 |
| 0161346 | 9/1983 | Japan | 437/183 |

Primary Examiner—Brian E. Hearn
Assistant Examiner—Tuan Nguyen
Attorney, Agent, or Firm—Cushman, Darby & Cushman

[57] ABSTRACT

According to the invention a method for making a semiconductor device comprising a step of preparing a semiconductor device having at least one semiconductor element formed in a semiconductor substrate, a plurality of electrode pads electrically connected to said semiconductor element and a passivation film provided on the surface thereof, a step of forming a leading layer on the surface of said electrode pads and a step of forming at least one bump electrode on the surface of said leading layer is provided and in this invention, since the prefabricated semiconductor device which may be sold by a standard supplier is used as the starting material and several steps for improving such a semiconductor device are applied thereto, the method for making a semiconductor device in which the whole manufacturing process thereof is simplified and the manufacturing cost thereof is remarkably reduced and moreover in which the developing cost thereof is greatly reduced development thereof can be speeded up, can be obtained.

19 Claims, 4 Drawing Sheets

Fig. 2
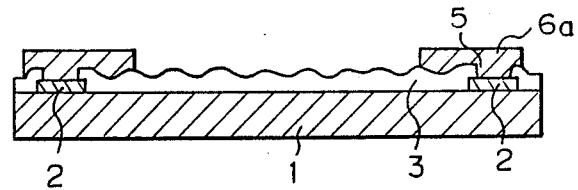
Fig. 3
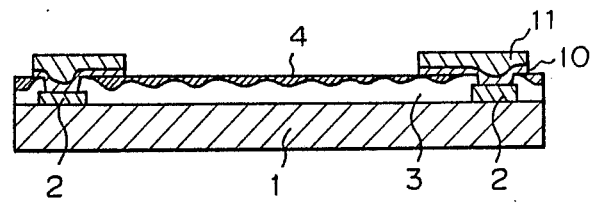
Fig. 4
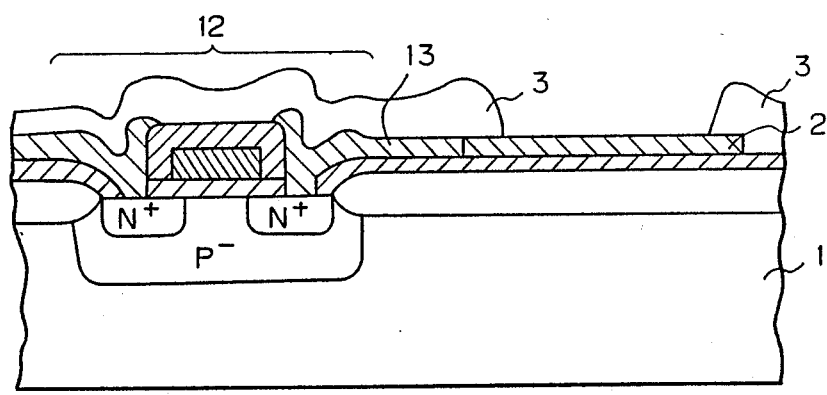
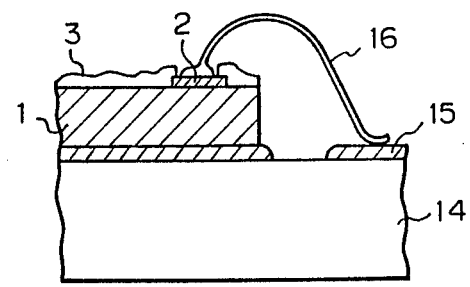
Fig. 5

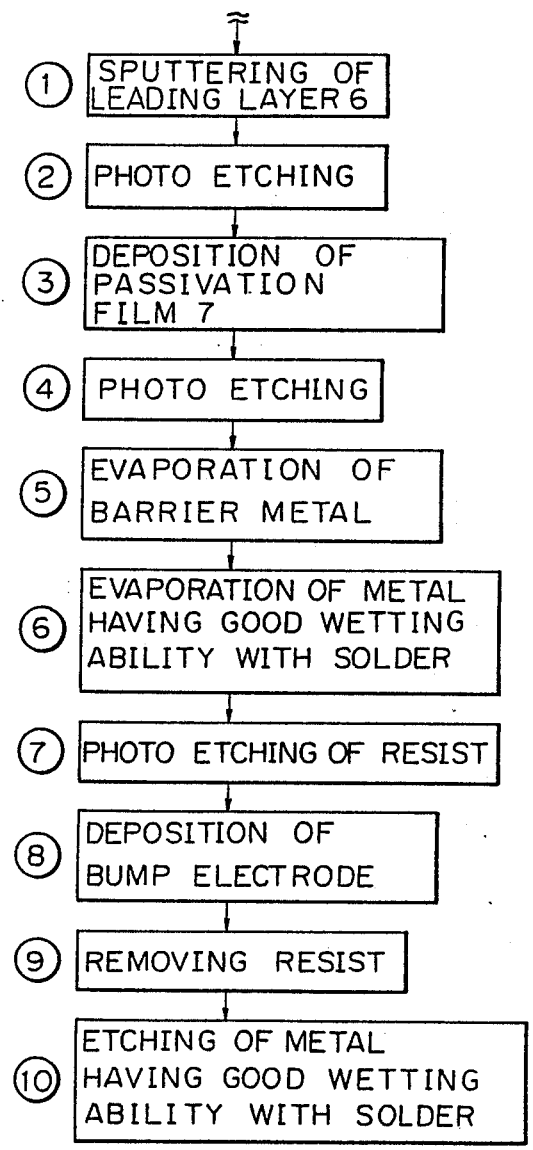
Fig. 6a EXAMPLE 1

EXAMPLE 3

METHOD FOR MAKING A SEMICONDUCTOR DEVICE

BACKGROUND OF THE INVENTION

1. Field of the Invention

This invention relates to a method for making a semiconductor device and especially relates to a method for making a semiconductor device having a projecting electrode (referred to hereafter as a bump electrode) connecting to another electrode.

2. Description of the Related Art

First of all, a wire bonding type semiconductor device which is used for a wire bonding system to make a final semiconductor device will be explained with reference to FIG. 1(a) and FIG. 4 showing a cross sectional view thereof and a partial enlarged cross sectional view thereof respectively.

In these figures, a semiconductor device comprises a semiconductor substrate 1, and a semiconductor element 12, for example a MOS transistor, is provided in the semiconductor substrate 1, as shown in FIG. 4.

And further, on the semiconductor substrate, at least one electrode pad 2 is provided so as to electrically connect to the external terminal of the wiring on the surface of the substrate on which the semiconductor device will be mounted, and the electrode pad 2 and each of the semiconductor element 12 are electrically connected to each other with the wiring means 13 consisting of, for example, Al or the like.

Generally, the electrode pad 2 and the wiring means 13 are usually made of the same material.

Moreover, as shown in these figures, a passivation film 3 consisting of, for example, a $SiO_2$, SiN film, $Al_2O_3$ film, or the like, is formed on the surface of the semiconductor device as a deactivation treatment in order to reduce the unfavorable effects caused by a contamination on the surface of the semiconductor element or an electrolysis thereof, and after that an opening is formed by selectively removing a portion of the passivation film 3 mounted on the electrode pad 2.

A type of semiconductor device such as mentioned above is usually die-bonded in a face-up condition to a surface of a substrate 14 as shown in FIG. 5 and the electrode pad 2 of the semiconductor device is connected to a terminal 15 on the surface of the substrate 14 by a wire 16 using a wire-bonding method.

However, the wire bonding type semiconductor device as described above, normally has an advantage in that it usually has a relatively high degree of freedom in wiring, although it also has such deficits such as the strength of the connecting portion thereof is rather weak due to the connecting portion being formed by such a wire bonding method and a monopolized area for such a bonding portion is naturally increased.

Further, there is another problem wherein such a wire bonding type semiconductor device has an inferior characteristic of a resistance to its environment because it is mounted on the substrate by the face-up method.

On the other hand, generally speaking, since an initial breakdown ratio of the semiconductor device usually comes to about 30% of the total number of breakdowns thereof as a breakdown mode of the semiconductor device, a reliability check is usually carried out for each semiconductor device by way of a burn-in test before the shipment thereof.

However, when such a wire bonding type semiconductor device as described above is once assembled into a substrate, to make, for example, a hybrid integrated circuit, it is impossible for the semiconductor devices to be exchanged each other, and accordingly, if a semiconductor device having a low reliability is detected, the entire hybrid integrated circuit per se should be scrapped resulting in higher production costs.

Accordingly, in recent years, a so called flip chip type semiconductor device having a wiring with bump electrodes on the surface thereof and being mounted on a surface of a substrate in such a way that the surface thereof having wiring with bump electrodes is directed downwardly in a face down condition to make an electrical connection between the bump electrode and the terminal on the surface of the substrate without using any wiring, is used frequently in this field.

A typical flip chip type semiconductor device as mentioned above is disclosed in Japanese Unexamined Patent Publication No. 59-161051.

This flip chip type semiconductor device described above for instance has an advantage that since it uses no wiring to make a connection, a monopolized area for a bonding portion is reduced to a great extent and it has a superior characteristic of resistance to its environment.

Further, in such a flip chip type semiconductor device, the production cost can be reduced because it can be easily replaced after assembly by only heat treating the bump electrode portion to melt the solder.

However, once after the flip chip type semiconductor device is designed and produced, it is difficult for the bump electrode location to be replaced and the degree of freedom of wiring thereof is small, for example, when a wiring pattern or the like on the surface of the substrate on which said semiconductor device is mounted, is changed, a new design thereof is required even if the required performance is still unchanged, and accordingly this kind of semiconductor device has disadvantages over the production of multiple kinds of devices in lower quantities because of the necessary time and cost for producing the semiconductor device including the semiconductor element. In the method for making such a flip chip type semiconductor device disclosed in Japanese Unexamined Patent Publication No.59-161051, the first step thereof is preparing the substrate including only a semiconductor element therein.

Accordingly, in this method, there are many steps required in the course of manufacturing the final object of the semiconductor device causing the process per se to be complicated and the production cost to be increased.

And further, in Japanese Unexamined Patent Publication No.59-161051, the object thereof is to provide a semiconductor device having a size as small as possible, and for that reason, the bump electrode is arranged on the center of the semiconductor device.

But in such a configuration, since the passivation film of the substrate, on the surface of which the bump electrodes are mounted, is generally so weak that it can be easily cracked and broken, SiN film is used to prevent the occurrence of such cracks or breakages.

However, the use of SiN film as a passivation film will result in some restrictions of the manufacturing process causing the degree of freedom of the material selection to be decreased and making the process more complicated and the production cost higher.

Further, in the prior art, as the semiconductor device has a special configuration, when its design is to be modified, it is required to redesign it again entirely from the starting material, reducing the development speed and increasing the development cost.

SUMMARY OF THE INVENTION

Accordingly, to overcome the disadvantages mentioned above, the object of the invention is to provide a method for making a semiconductor device which can be developed rapidly and at a lower cost while still being suitable for small quantity production of various types of objects, and further to provide a method for making a semiconductor device in which the whole production process is simplified to reduce the production cost.

To attain the object of the invention mentioned above, the method for making a semiconductor device basically comprises,
 a step of preparing a semiconductor device having at least one semiconductor element formed in a semiconductor substrate, a plurality of electrode pads electrically connected to said semiconductor element and a passivation film provided on the surface thereof,
 a step of forming a leading layer on the surface of said electrode pads
 a step of forming at least one bump electrode on the surface of said leading layer.

According to the invention, firstly, a semiconductor device which is already fabricated for actual usage is prepared and then to such semiconductor device thus prepared, a leading layer forming step and a bump electrode forming step are applied respectively to make a final product of a semiconductor device.

Therefore, in this invention, the semiconductor device produced as a final product basically has a configuration comprising a wire bonding type semiconductor device as a basic material having at least one semiconductor element formed in a semiconductor substrate, a plurality of electrode pads electrically connected to said semiconductor element and a passivation film provided on the surface thereof, a leading layer provided on the surface of said electrode pads electrically connected thereto and at least one bump electrode on the surface of said leading layer.

BRIEF DESCRIPTION OF THE DRAWINGS

FIG. 2 is a cross sectional view of the semiconductor device explaining the process of the Example 2 of this invention.

FIG. 3 is a cross sectional view of the semiconductor device explaining the process of the Example 3 of this invention.

FIG. 4 is a partially enlarged cross sectional view of the semiconductor device shown in FIG. 1.

FIG. 5 is a cross sectional view of the semiconductor device indicating the condition in which the wire bonding type semiconductor device is die-bonded to a substrate.

FIGS. 6(a) and 6(b) are the flow charts of the Example 1 and the Example 3, respectively, of the invention to compare the manufacturing steps of both examples to each other.

DESCRIPTION OF THE PREFERRED EMBODIMENTS

Figure 1A:
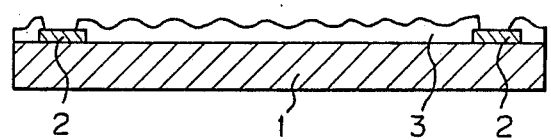
FIG. 1(a) to (c) are cross sectional views of the semiconductor device explaining the process of the Example 1 of this invention, sequentially.

As mentioned above, in this invention, to use a semiconductor device which is already produced and is easily obtainable from a standard source is a characteristic point of this invention in order to reduce the developing and production cost thereof while simplifying the production steps in accordance with the object of this invention.

Therefore, in this invention, any kind of wire bonding type semiconductor device can be used as long as it is has sufficient performance to comply with that of the substrate to be used.

And further, in this invention, even if the wiring pattern of the said wire bonding type semiconductor device does not comply with a position of the suitable terminals of the leading on said substrate, such differences can be easily overcome by adjusting the position of the leading layer and/or the bump electrode to a suitable place on the semiconductor device in the leading layer forming step and the bump electrode forming step respectively.

In this invention, the basic manufacturing process of the semiconductor device is described above, although many variations thereof can be introduced into this invention.

In this invention, a barrier metal film consisting of, for example, Cr or Ti may be formed on the surface of the electrode pads before the step of forming a leading layer is carried out.

In such a case, for example, another method for making a semiconductor device of this invention may comprise steps such as,
 a step of preparing a semiconductor device having at least one semiconductor element formed in a semiconductor substrate, a plurality of electrode pads electrically connected to said semiconductor element and a passivation film provided on the surface thereof,
 a step of forming a barrier metal film at least on the surface of said electrode pads,
 a step of forming a leading layer on the surface of said barrier metal film and said passivation film,
 a step of forming at least a bump electrode on the surface of said leading layer.

On the other hand, in this invention, such a barrier metal film may be applied to the surface of the leading layer before the bump electrodes are formed on the surface of the leading layer, instead of applying the same to the surface of the electrode pads.

In such a case, for example, another separate method for making a semiconductor device of this invention may comprise steps such as,
 a step of preparing a semiconductor device having at least one semiconductor element formed in a semiconductor substrate, a plurality of electrode pads electrically connected to said semiconductor element and a passivation film provided on the surface thereof,
 a step of forming a leading layer on the surface of said electrode pads,
 a step of forming a barrier metal film at least on the surface of said leading layer,
 a step of forming at least a bump electrode on the surface of said barrier metal film.

In this invention, the leading layer mounted on the surface of the electrode pads may be formed by any type of known process for forming such leading layer, such as a sputtering method, evaporation method or the like utilizing a conductive material such as Al, Mo, Pt, Ti, Cr or the like, and as the case may be, the material having good wetting ability with solder such as Cu, Au and Ni can be used as the wiring material and may be formed into the leading layer by, for example, a bias sputtering method.

In another embodiment, materials having good wetting ability with solder may be deposited on the surface of the leading layer or on the surface of the barrier metal film as one of the components of the leading layer.

In this invention, as shown in FIGS. 1 and 4, the passivation film formed on the semiconductor substrate 1 and at least one portion of the electrode pads 2, usually has some surface roughness which causes difficulty in making each surface of every leading layer be in the same plane.

Accordingly, in this invention, a process for flattening the surface roughness of the passivation film may be carried out before the step of forming the leading layer on the passivation film and on at least one portion of the electrode pads.

Alternatively, if there is another pertinent method for making each respective surface of the leading layer be in the same plane, it can be used instead of the method mentioned above.

In this invention, the bump electrode may be provided by any known process such as a chemical plating method or a chemical etching method or the like utilizing a conductive material such as Cu, Au, Ni, Sn, Pb or the like.

EXAMPLES

Examples of this invention will be described hereunder with reference to attached drawings.

EXAMPLE 1

Figure 1B:
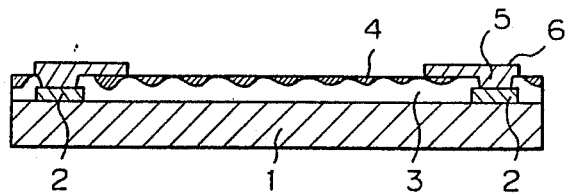
Figure 1C:
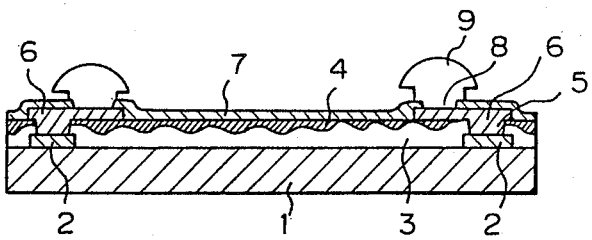

FIG. 1 shows a drawing illustrating the process of the Example 1 of this invention and FIGS. 1(a) to (c) are the cross sectional views of the semiconductor device sequentially explaining the process of the Example 1 of this invention.

Figure 1D:
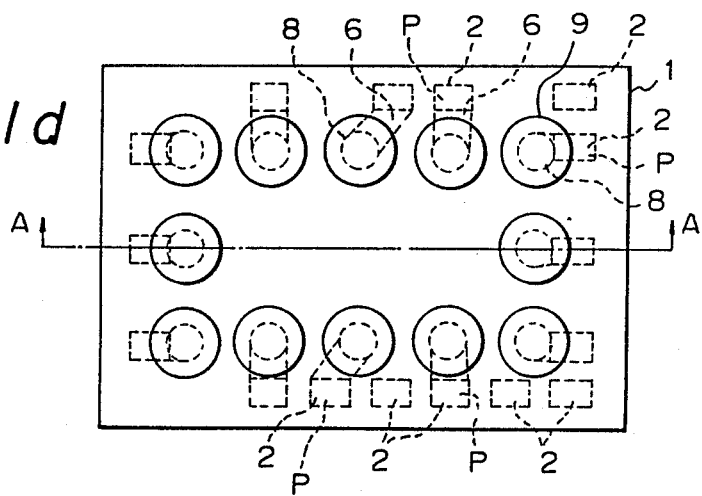
FIG. 1(d) shows a plane view of the semiconductor device produced in the Example 1.

FIG. 1(d) shows a plane view of the semiconductor device produced in the Example 1 and FIG. 1(c) shows the cross sectional views of the semiconductor device taken from the A—A line in FIG. 1(d).

Firstly, as shown in FIG. 1(a) and FIG. 4, a wire bond type semiconductor device having at least one semiconductor element 12 formed in a semiconductor substrate 1, and a plurality of electrode pads 2 electrically connected to said semiconductor element 12 and a passivation film 3, both of which are provided on the surface of the semiconductor substrate 1, are prepared.

In this invention, the wire bond type semiconductor device may be newly designed and produced to comply with the object of the invention or if an existing wire bond type semiconductor device from a standard source satisfies the desired performance to attain the object of this invention, it can also be used in this invention.

A top surface of the passivation film 3 of the wire bonding type semiconductor device thus obtained has an irregular configuration with the surface roughness Rmax being about 1-2 μm which reflects the irregular configuration consisting of concave portions and projecting portions of the surface of the semiconductor element 12 located just below the passivation film 3, as shown in FIG. 4.

Accordingly, in the next step, as shown in FIG. 1(b), the surface of the passivation film 3 is flattened.

For flattening the surface of the passivation film 3, an etch back method, a bias sputtering method, a bias CVD method, a SOG (Spin On Glass) method, a method utilizing PIQ (a product name) or the like can be used in this process as an actual flattening method and therefore, in FIG. 1(b), the surface of the passivation film which is flattened by the method in which the concave portions on the passivation film 3 are filled with an insulating film 4 consisting of a P-SiN film, SiO₂ film, polyimide film or the like utilizing a method mentioned above, is shown.

Next the through holes 5 are formed by selectively removing the portions of the passivation film 3 with the insulating film 4 therefrom, which respectively covers the selected electrode pads P among the plurality of the electrode pads 2 provided on the peripheral portion of the semiconductor device.

When the through hole is formed, it is preferable for a tapered portion to be provided on the peripheral portion of the hole in order to prevent a break down of the wiring layer as described later.

The leading layer 6 consisting of a conductive material such as Al or the like, electrically connected to the electrode pad through the through hole 5, is formed by using a sputtering method, for example, and the wiring layer having predetermined pattern is successively completed by using a photo-etching method.

In this step, each surface of the leading layer 6 is well flattened and therefore all of the surfaces of the leading layer 6 can be generally formed in the same plane since the surface of the passivation film 3 is flattened as mentioned above.

And further, the pattern thereof can be formed freely on the surface of the passivation film 3.

Next, as shown in FIG. 1(c), on the surface of the passivation film 3 with the patterned leading layer 6, another passivation film 7 consisting of, for example, a P-SiN film or P-SiO₂ film or the like, is deposited by a plasma CVD method, as one example, and after that an opening 8 is formed on a desired place in this passivation film which is locating over the leading layer 6.

In this step, when a plasma CVD method is used to form the second passivation film 7, for example a P-SiN film utilizing SiN as mentioned above, since the stress of the P-SiN is so large that the coefficient of thermal expansion thereof is around $5 \times 10^9$ dyn/cm² for example, there are many chances for a leading layer consisting of Al to be distorted by that stress.

Therefore in this invention, in order to prevent heavy stress being applied, a plasma CVD method with TEOS (Tetraethoxysilane) to form a P-SiO₂ film may be used in this step, and since the coefficient of thermal expansion of P-SiO₂ is about $0.1 - 1 \times 10^9$ dyn/cm², such stress can be reduced thereby effectively avoiding distortion of the Al leading layer.

Subsequently, though not shown in FIG. 1, a barrier metal is deposited by an evaporation method utilizing a metal such as Cr, Ti, or the like, on the surface of passivation film 7, including the opening 8, to form the barrier metal film, and successively, a metal having a good wetting ability with solder such as Cu, Au, Ni or the like, is deposited on the surface of the barrier metal film by the evaporation method.

Thereafter, the resist is coated on the surface of the metal film consisting of the material having a good wetting ability with solder and then the resist is selectively removed by the photo etching method.

The bump electrode 9 is then formed on the place where the resist was removed in the previous step, by a chemical plating method utilizing a metal such as Cu, for example.

And finally, the semiconductor device of the Example 1 can be obtained by etching the barrier metal film 10 and the metal film having a good wetting ability with solder after removing the resist.

As mentioned above, this semiconductor device can be mounted on the substrate in a face down condition with a suitable solder in the same manner in which the current flip chip type semiconductor device is connected to a substrate.

According to this Example 1, for the wire bonding type semiconductor device, as a semiconductor device already produced and sold in the market can be used, the development cost thereof will be greatly reduced and development can be speeded up even when the semiconductor device to be developed and used is a product for low quantity production but having several different types.

The height of each bump electrode 9 is uniform so as to obtain a semiconductor device having superior reliability because each surface of the leading layer 6, which is a base layer of the bump electrode 9, is well flattened as mentioned above.

Furthermore, in this invention, the leading layer 6 electrically connected between the electrode pad 2 and the bump electrode 9 can be designed freely in any desired pattern, and accordingly the distance between adjacent bump electrodes 9 can be extended in comparison with the distance between adjacent electrode pads 2, and the location of these bump electrodes can be arranged freely.

EXAMPLE 2

Another embodiment of this invention will be described hereunder as EXAMPLE 2 with reference to FIG. 2.

In the Example 1, the step for flattening of the surface of the passivation film 3 is carried out before the step of forming the leading layer 6 is carried out, though in this Example 2, the leading layer 6a is directly formed by a bias sputtering method to make the surface thereof flat without applying a flattening operation to the surface of the passivation film 3.

Even when such a leading layer production method is used in this Example 2, if the surface of the leading layer 6a is formed to be flat, and the respective surface of each leading layer 6a is formed on the same plane, the height of each respective bump electrode will become the same as each other when the bump electrodes are formed in the later steps.

The process carried out after the step of forming the leading layer 6a in this example, will be the same as shown in the Example 1.

EXAMPLE 3

Another embodiment of this invention will be described hereunder as EXAMPLE 3 with reference to FIG. 3.

In this Example 3, the process up to the step for flattening the surface of the passivation film 3 utilizing the insulating film 4 in Example 1, can be applied to this Example 3, though after the completion of the flattening operation, the rest of the process in this Example is characterized in that a barrier metal is first directly deposited on the surface of the electrode pad 2 by an evaporating method, for example, to form the barrier metal film 10 and thereafter, the metal layer 11 consisting of a metal having a good wetting ability with solder is deposited on the surface of the barrier metal film 10 as the leading layer by the bias sputtering method or the like to form a two layered construction consisting of the metal layer 11, and the barrier metal film 10 and such a construction is different from the counter part construction in the Example 1 in which the leading layer 6, the barrier metal film, and the metal layer consisting of such metal having a good wetting ability with solder, are accumulated one by one as described to form a three layered construction.

In this example, after the metal layer 11 is formed, the barrier metal film 10 and the metal layer 11 are removed by an etching method with only the necessary portions remaining, another passivation film is deposited on the surface thereof, and thereafter, the openings are selectively provided in the desired location over the metal layer 11 in the passivation film.

The bump electrodes are then formed on the opening portion provided on the passivation film 11 by an electroless deposition method such as the chemical copper deposition method.

Figure 6B:
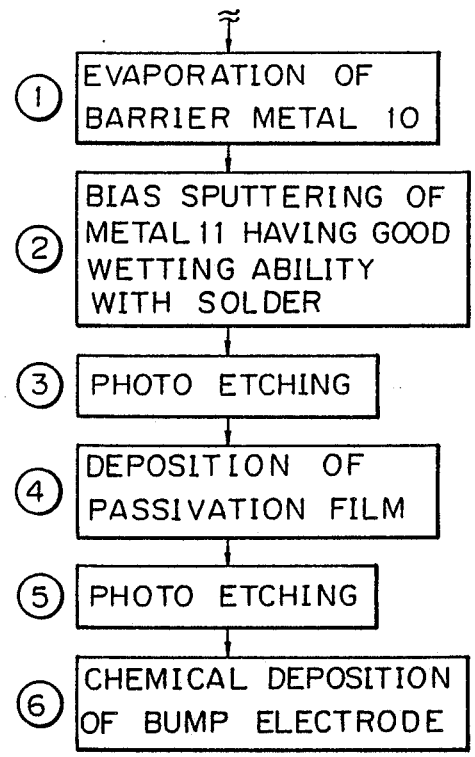

In this Example 3, the semiconductor device thus produced can also have the same effect as that of the semiconductor device produced in Example 1, but as is apparent from comparison with the FIGS. 6(a) and 6(b), the manufacturing process of the Example 3 as shown in FIG. 6(b) can be simplified in comparison with that of Example 1 by omitting 4 steps from the manufacturing process of the Example 1 as shown in FIG. 6(a), and such a situation will cause a significant reduction in the production cost thereof.

Although, this invention is described above by the Examples 1 to 3, it is not restricted thereto, since it is apparent that this invention can be applied to the many variable as shown hereunder as long as they do not fall outside of the scope of this invention.

For instance, this invention can also be applied to the so called TAB (Tape Auromated Bonding System) system in which at first, a copper foil, previously attached to the surface of a film tape is photo-etched, and then the lead frame previously formed on the film tape is bonded to a bump electrode consisting of Au, for example, by a thermocompression bonding method.

FUNCTION AND EFFECT OF THE INVENTION

According to the invention, a semiconductor device can be obtained by improving the current wire bonding type semiconductor device and therefore, when it is intended to develop a kind of semiconductor device, it is not necessarily required to design the semiconductor device from the first step thereof, and when a semiconductor device already produced and sold through ordinary sources is used, the designing operation can be carried by the process being applied to the prefabricated semiconductor device thus prepared.

Moreover, in this invention, a flip chip type semiconductor device can be obtained by improving the wire bonding type semiconductor device, the development cost thereof will be reduced to become remarkably cheap, and such development can be speeded up even when the semiconductor device to be developed and used is a product for low quantity production but having several different types, thereby effectively utilizing the advantage of the flip chip type semiconductor device.

And further, to use the material having a good wetting ability with solder usually required to form such a bump electrode, as the material for the leading layer which wires between the electrode pad and the bump electrode, can omit the step of forming another conductive material causing the whole manufacturing process thereof to be simplified and the manufacturing cost thereof to be reduced.

We claim:

1. A method of making a semiconductor device which comprises:
   preparing a wire bonding type semiconductor device having at least one semiconductor element formed in a semiconductor substrate, a plurality of electrode pads electrically connected to said semiconductor element and a passivation film provided on the surface thereof,
   forming a leading layer over the surface of said electrode pads, and
   forming at least one bump electrode over the surface of said leading layer.

2. A method of making a semiconductor device according to claim 1, including forming a barrier metal film at least on the surface of said electrode pads, said leading layer being formed at least on the surface of said barrier metal film.

3. A method of making a semiconductor device according to claim 2, wherein said forming of a leading layer is carried out, after said barrier metal film is formed, by using a material having a good wetting ability with solder on the surface of said barrier metal film.

4. A method of making a semiconductor device according to claim 1, including forming a barrier metal film at least on the surface of said leading layer, said forming of at least one bump electrode being on the surface of said barrier metal film.

5. A method of making a semiconductor device according to claim 4, including forming on the surface of said barrier metal film another metal film having a good wetting ability with solder.

6. A method of making a semiconductor device according to claim 1 including flattening a surface of said passivation film.

7. A method of making a semiconductor device according to claim 1 including flattening a surface of said leading layer simultaneously with forming said leading layer.

8. A method of making a semiconductor device according to claim 1 wherein forming a bump electrode is carried out by chemical plating.

9. A method of making a semiconductor device according claim 1 wherein said preparing of a semiconductor device is carried out by using a semiconductor device already fabricated for actual usage.

10. A method of making a semiconductor device which comprises:
    preparing a semiconductor device having at least one semiconductor element formed in a semiconductor substrate, a plurality of electrode pads electrically connected to said semiconductor element and a passivation film provided on the surface thereof,
    forming a leading layer over the surface of said electrode pads,
    forming at least one bump electrode on the surface of said leading layer and
    flattening a surface of said leading layer simultaneously with forming said leading layer.

11. A method of making a semiconductor device according to claim 10, including forming a barrier metal film at least on the surface of said electrode pads, said leading layer being formed at least on the surface of said barrier metal film.

12. A method of making a semiconductor device according to claim 11, wherein said forming of a leading layer is carried out, after said barrier metal film is formed, by using a material having a good wetting ability with solder on the surface of said barrier metal film.

13. A method of making a semiconductor device according to claim 10, including forming a barrier metal film at least on the surface of said leading layer, said forming of at least one bump electrode being on the surface of said barrier metal film.

14. A method of making a semiconductor device according to claim 11, including forming another metal film having a good wetting ability with solder, on the surface of said barrier metal film.

15. A method of making a semiconductor device according to claim 10 including flattening a surface of said passivation film.

16. A method of making a semiconductor device according to claim 10 wherein forming a bump electrode is carried out by chemical plating.

17. A method of making a semiconductor device according to claim 10 wherein said preparing of a semiconductor device is carried out by using a semiconductor device already fabricated to actual usage.

18. A method of making a semiconductor device according to claim 10, wherein said step of forming a leading layer is carried out by bias sputtering.

19. A method of making a semiconductor device which comprises:
    preparing a semiconductor device having at least one semiconductor element formed in a semiconductor substrate, a plurality of electrode pads electrically connected to said semiconductor element and a passivation film provided on the surface thereof,
    said preparing of the semiconductor device being carried out by using a semiconductor device already fabricated for actual usage,
    forming a leading layer over the surface of said electrode pads, and
    forming at least one bump electrode over the surface of said leading layer.

* * * * *